United States Patent
Takechi

(10) Patent No.: US 10,388,798 B2
(45) Date of Patent: Aug. 20, 2019

(54) THIN FILM TRANSISTOR, DISPLAY DEVICE, TRANSISTOR CIRCUIT, AND DRIVING METHOD OF THIN FILM TRANSISTOR

(71) Applicant: Tianma Japan, Ltd., Kawasaki, Kanagawa (JP)

(72) Inventor: Kazushige Takechi, Kawasaki (JP)

(73) Assignee: TIANMA JAPAN, LTD., Kawasaki, Kanagawa (JP)

( * ) Notice: Subject to any disclaimer, the term of this patent is extended or adjusted under 35 U.S.C. 154(b) by 0 days.

(21) Appl. No.: 15/828,586

(22) Filed: Dec. 1, 2017

(65) Prior Publication Data

US 2018/0166585 A1   Jun. 14, 2018

(30) Foreign Application Priority Data

Dec. 13, 2016   (JP) .................................. 2016-241604

(51) Int. Cl.
*H01L 29/04* (2006.01)
*H01L 29/10* (2006.01)
(Continued)

(52) U.S. Cl.
CPC ......... *H01L 29/78693* (2013.01); *G09G 3/20* (2013.01); *G09G 3/3233* (2013.01); *G09G 3/3266* (2013.01); *G09G 3/3648* (2013.01); *G09G 3/3655* (2013.01); *G09G 3/3677* (2013.01); *H01L 27/12* (2013.01);
(Continued)

(58) Field of Classification Search
USPC ..... 257/57, 66, 72, 223, 227, 291, 292, 439, 257/443, 655, E27.1, E27.125, E27.112, 257/E27.117, E29.145, E29.147, E29.151, 257/E29.182, E29.202, E29.273–E29.299,
(Continued)

(56) References Cited

U.S. PATENT DOCUMENTS

2009/0206332 A1\* 8/2009 Son .................. H01L 29/42384
257/43
2012/0007084 A1   1/2012 Park et al.
(Continued)

FOREIGN PATENT DOCUMENTS

JP   2012-019206 A   1/2012

*Primary Examiner* — Niki H Nguyen
(74) *Attorney, Agent, or Firm* — Sughrue Mion, PLLC

(57) ABSTRACT

The oxide semiconductor thin film transistor includes a source electrode and a drain electrode; a channel layer formed of an oxide semiconductor; a first insulating film; a first gate electrode formed on a surface side opposing a first channel region which is formed on an interface between the channel layer and the first insulating film; a second insulating film; and a second gate electrode formed on a surface side opposing a second channel region which is formed on an interface between the channel layer and the second insulating film, and in a case where a length of an apposition direction of the source electrode and the drain electrode in the first channel region is set to a first channel length, and a length of a apposition direction in the second channel region is set to a second channel length, the second channel length is shorter than the first channel length, and a potential applied to the second gate electrode is greater than or equal to a lower potential of potentials of the source electrode and the drain electrode.

14 Claims, 16 Drawing Sheets

(51) Int. Cl.
*H01L 31/00* (2006.01)
*H01L 29/786* (2006.01)
*H01L 27/12* (2006.01)
*H01L 51/56* (2006.01)
*H01L 29/66* (2006.01)
*H01L 27/32* (2006.01)
*G09G 3/20* (2006.01)
*G09G 3/3233* (2016.01)
*G09G 3/3266* (2016.01)
*G09G 3/36* (2006.01)
*G02F 1/1368* (2006.01)
*H01L 51/00* (2006.01)

(52) U.S. Cl.
CPC ...... *H01L 27/1225* (2013.01); *H01L 27/3276* (2013.01); *H01L 29/10* (2013.01); *H01L 29/66* (2013.01); *H01L 29/66969* (2013.01); *H01L 29/786* (2013.01); *H01L 29/78648* (2013.01); *H01L 51/56* (2013.01); *G02F 1/1368* (2013.01); *G09G 2300/043* (2013.01); *G09G 2300/0408* (2013.01); *G09G 2300/0842* (2013.01); *G09G 2320/0233* (2013.01); *G09G 2320/0247* (2013.01); *G09G 2320/045* (2013.01); *H01L 27/3262* (2013.01); *H01L 27/3272* (2013.01); *H01L 51/0096* (2013.01)

(58) Field of Classification Search
USPC ..... 257/E29.314, E29.32, E23.016; 438/149, 438/163
See application file for complete search history.

(56) References Cited

U.S. PATENT DOCUMENTS

| 2012/0298999 | A1* | 11/2012 | Jinbo | H01L 29/04 257/57 |
| 2015/0144952 | A1* | 5/2015 | Kim | H01L 27/3262 257/72 |
| 2016/0027827 | A1* | 1/2016 | Sekine | H01L 27/14612 250/370.09 |
| 2017/0047449 | A1* | 2/2017 | Takechi | H01L 29/7869 |

* cited by examiner

F I G. 9
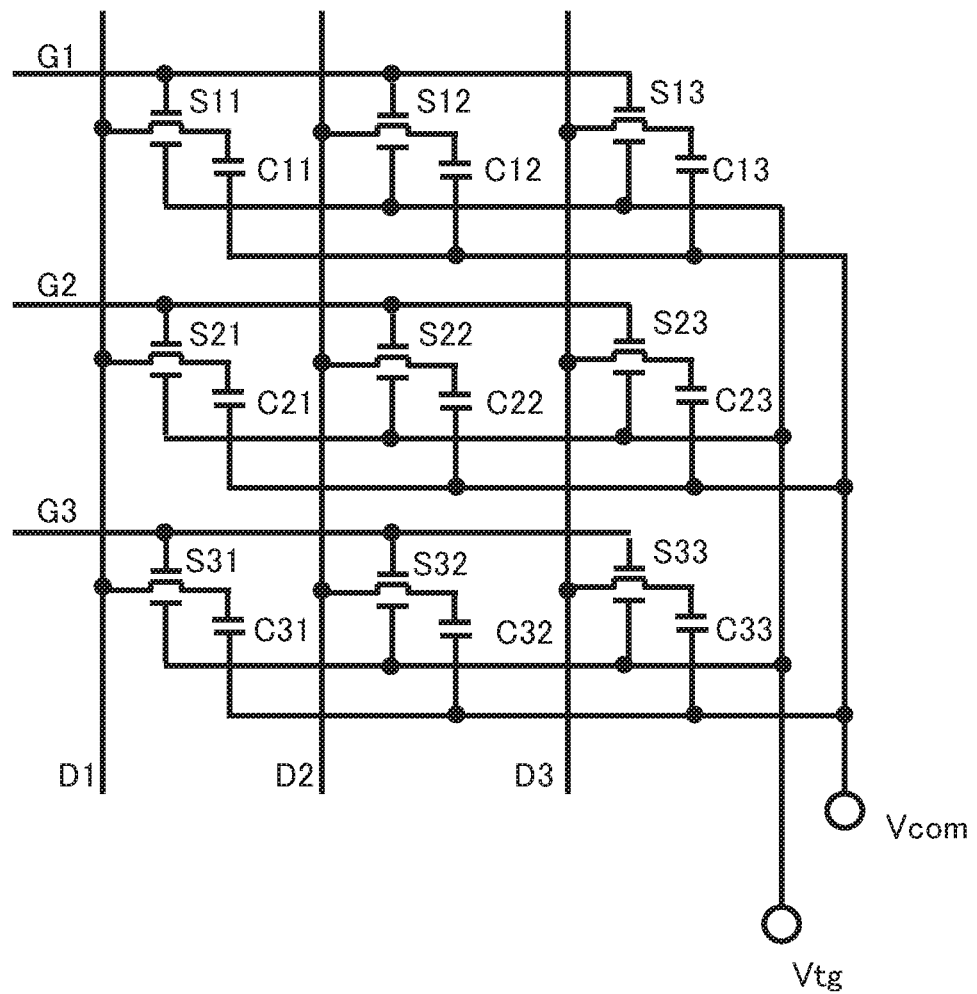

THIN FILM TRANSISTOR, DISPLAY DEVICE, TRANSISTOR CIRCUIT, AND DRIVING METHOD OF THIN FILM TRANSISTOR

This non-provisional application claims priority under 35 U.S.C. § 119(a) on Patent Application No. 2016-241604 filed in Japan on Dec. 13, 2016, the entire contents of which are hereby incorporated by reference.

FIELD

The present disclosure relates to a thin film transistor, a display device, a transistor circuit, and a driving method of a thin film transistor.

BACKGROUND

Recently, a thin film transistor (TFT) using an oxide semiconductor as a channel layer, a so-called oxide TFT has been widely used. The oxide TFT has characteristics of having high mobility with respect to the existing amorphous silicon (a-Si) TFT. For this reason, in a display device, the oxide TFT is adopted as a driving circuit, and thus, a reduction in the size of the circuit and a miniaturization of the wiring can be realized.

In the display device, a reduction in the size of the driving circuit and a miniaturization of the wiring contribute to the improvement in an aperture ratio of a pixel. As a result thereof, high resolution of the display device can be realized.

In a case where the oxide TFT is used as a peripheral driving circuit of a display adopting a liquid crystal display (LCD) or an organic light emitting diode (OLED), such as a pixel switch and a vertical shift register (VSR), excellent initial properties and long term stability are required.

For such a request, a driving method is proposed in which in a double gate type oxide TFT in which a top gate electrode is added to a bottom gate type oxide TFT, a negative potential is applied to the top gate electrode (for example, Japanese Patent Application Laid-Open No. 2012-19206). The negative potential is applied to the top gate electrode, and thus, a threshold voltage of the oxide TFT is moved to a positive side. As a result thereof, normally off of the oxide TFT is realized, and thus, excellent initial properties are obtained.

SUMMARY

However, in the oxide TFT, the bottom gate type oxide TFT, in particular, is easily affected by an unexpected charge existing on the TFT, compared to a hydrogenated amorphous silicon (a-Si:H) TFT. This is referred to as a top gate effect. The bottom gate type oxide TFT tends to show inferior initial properties and long term stability due to the top gate effect.

A thin film transistor of one aspect of the present disclosure, includes: a source electrode and a drain electrode; a channel layer formed of an oxide semiconductor to which the source electrode and the drain electrode are connected; a first insulating film formed on a first surface side of the channel layer; a first gate electrode formed on a surface side opposing a first channel region which is formed on a first interface between the channel layer and the first insulating film; a second insulating film formed on a second surface side of the channel layer; and a second gate electrode formed on a surface side opposing a second channel region which is formed on a second interface between the channel layer and the second insulating film, in which the source electrode and the drain electrode are apposed with a gap, and in a case where a length of an apposition direction of the source electrode and the drain electrode in the first channel region is set to a first channel length, a length of an apposition direction in the second channel region is set to a second channel length, the second channel length is shorter than the first channel length, and a potential applied to the second gate electrode is greater than or equal to a lower potential of potentials of the source electrode and the drain electrode.

The above and further objects and features will more fully be apparent from the following detailed description with accompanying drawings.

It is to be understood that both the foregoing general description and the following detailed description are exemplary and explanatory and are not restrictive of this disclosure.

BRIEF DESCRIPTION OF SEVERAL VIEWS OF DRAWINGS

FIG. 9 is a circuit diagram illustrating an example of the pixel circuit;

DETAILED DESCRIPTION

Hereinafter, embodiments will be described in detail with reference to the drawings.

Furthermore, ordinal numbers such as "first" and "second" in the specification and claims are applied in order to define a relationship between constituents and to prevent a confusion between constituents. Therefore, such ordinal numbers do not numerically limit the constituents.

In addition, the size or the scale of each of the constituents in each of the drawings is described by being suitably changed in order to ensure the visibility of the drawings. In addition, the hatching in each of the drawings is for distinguishing each of the constituents, and does not necessarily indicate a cutting surface.

Further, terms such as an "electrode" or "wiring", and a "terminal" do not functionally limit such constituents. For example, the "terminal" and the "wiring" can be used as a part of the "electrode". In addition, in contrast, the "electrode" and the "terminal" can be used as a part of the "wiring". In addition, in contrast, the "electrode" and the "wiring" can be used as a part of the "terminal".

Embodiment 1

Figure 1:
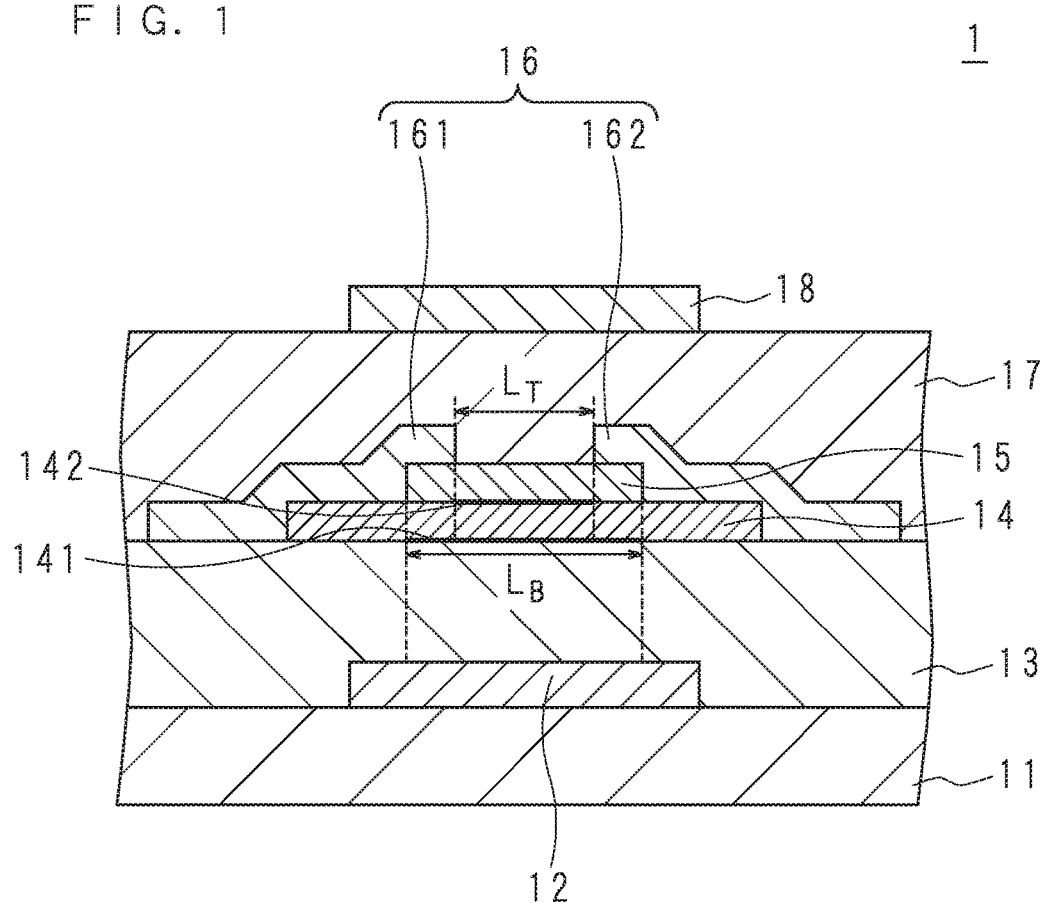
FIG. 1 is a cross-sectional view illustrating a configuration example of an oxide TFT according to a first embodiment.
Figure 2:
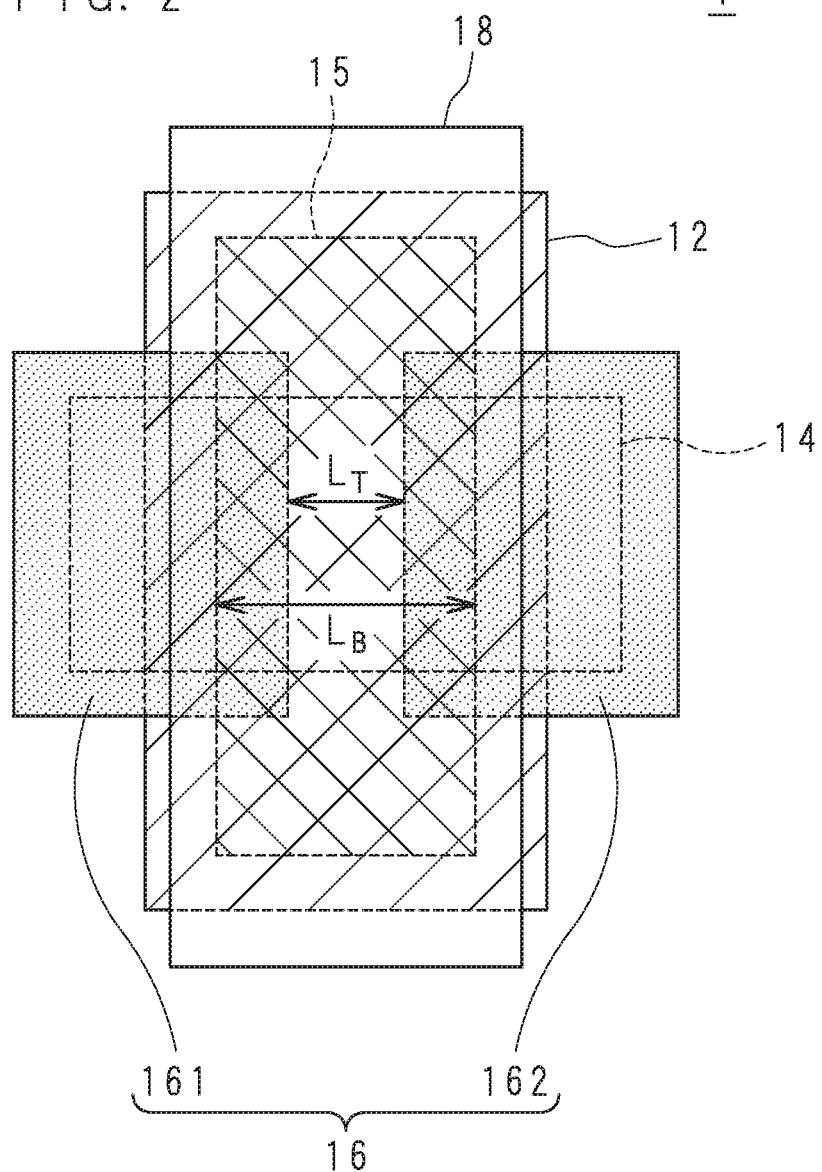
FIG. 2 is a plan view illustrating a configuration example of the oxide TFT according to the first embodiment.

FIG. 1 is a cross-sectional view illustrating a configuration example of an oxide TFT 1 according to a first embodiment. The oxide TFT 1 includes a substrate 11, a bottom gate electrode 12, a gate insulating film 13, an oxide semiconductor layer 14, an etching stop film 15, a source and drain electrode 16, a passivation film 17, and a top gate electrode 18. FIG. 2 is a plan view illustrating a configuration example of the oxide TFT 1 according to the first embodiment. In FIG. 2, the bottom gate electrode 12, the oxide semiconductor layer 14, the etching stop film 15, the source and drain electrode 16, and the top gate electrode 18 are illustrated. Furthermore, the source and drain electrode 16, the top gate electrode 18, and the bottom gate electrode 12 are connected to an external circuit through a contact hole (not illustrated).

As illustrated in FIG. 1, in the oxide TFT 1, the bottom gate electrode 12, the gate insulating film 13, the oxide semiconductor layer 14, the etching stop film 15, the source and drain electrode 16, the passivation film 17, and the top gate electrode 18 are laminated on the substrate 11 in this order.

The substrate 11 is in the shape of a rectangular plate. The substrate 11 is an insulating substrate such as a glass substrate.

The bottom gate electrode 12 is formed of metals such as molybdenum (Mo), niobium (Nb), tungsten (W), aluminum (Al), chromium (Cr), copper (Cu), or silver (Ag). The bottom gate electrode 12 may be formed by laminating such metals. In addition, the bottom gate electrode 12 may be formed by using a copper alloy, an aluminum alloy, or a silver alloy. The top gate electrode 18 is also formed as with the bottom gate electrode 12.

The gate insulating film 13, for example, is formed of silicon oxide ($SiO_2$) or silicon nitride ($Si_3N_4$). The gate insulating film 13 may be formed by laminating silicon oxide and silicon nitride. In addition, the gate insulating film 13 may be formed by using aluminum oxide or tantalum oxide. The etching stop film 15 and the passivation film 17 are also formed as with the gate insulating film 13.

The oxide semiconductor layer 14 is a layer formed of an oxide semiconductor such as IGZO. The IGZO is a compound of as indium (In), gallium (Ga), zinc (Zn), and oxygen (O). The oxide semiconductor layer 14 may be formed of a compound of indium, zinc and oxygen (In—Zn—O), a compound of indium, gallium, and oxygen (In—Ga—O), or a compound of indium, silicon, and oxygen (In—Si—O).

The source and drain electrode 16 includes two electrodes of an electrode 161 and an electrode 162. One electrode of two electrodes of the electrode 161 and the electrode 162 functions as a source electrode, and the other electrode functions as a drain electrode, according to an operation state of the oxide TFT 1. That is, there are a case where the electrode 161 functions as the source electrode, and the electrode 162 functions as the drain electrode, and a case where the electrode 161 functions as the drain electrode, and the electrode 162 functions as the source electrode. In the following description, for the sake of simplicity, the electrode 161 will be referred to as a source electrode 161, and the electrode 162 will be referred to as a drain electrode 162. The source electrode 161 and the drain electrode 162 have approximately the same shape. As illustrated in FIG. 1 and FIG. 2, the source electrode 161 and the drain electrode 162 are apposed with a gap. The source and drain electrode 16 is formed of molybdenum, titanium, tungsten, aluminum, or the like. The source and drain electrode 16 may be formed of a molybdenum alloy, a titanium alloy, an aluminum alloy, a copper alloy, and the like. The source and drain electrode 16 may be formed by laminating a plurality of single metals or alloys.

As illustrated in FIG. 1, in the oxide TFT 1 of this embodiment, the length of the etching stop film 15 in a horizontal direction on the plane (hereinafter, referred to as a horizontal width) is less than a horizontal width of the oxide semiconductor layer 14. A horizontal width of the gap between source electrode 161 and the drain electrode 162 is less than the horizontal width of the etching stop film 15. For this reason, as illustrated in FIG. 1, the source electrode 161 and the drain electrode 162 are in the shape of a step in the cross-sectional view. Thus, the oxide TFT 1 of this embodiment is an etching stop type TFT. In the oxide TFT 1, a channel layer is formed on the oxide semiconductor layer 14. Furthermore, in FIG. 1, a horizontal width of the gate electrode 12 is narrower than the horizontal width of the oxide semiconductor layer 14, but is not limited thereto. A horizontal width of the gate electrode 12 is wider than the horizontal width of the oxide semiconductor layer 14.

In addition, in the oxide TFT 1, a horizontal width of the top gate electrode 18 is greater than the horizontal width of the gap between the source electrode 161 and the drain electrode 162. The horizontal width of the bottom gate electrode 12 is wider than the horizontal width of the etching stop film 15. In the oxide semiconductor layer 14, a first channel region 141 is formed in a part of an interface with respect to the gate insulating film 13. More specifically, a region on the interface overlapping with the etching stop film 15 in the plane view is the first channel region 141. The first channel region 141 is a region where a carrier density can be controlled according to a voltage of the bottom gate electrode 12. In addition, in the oxide semiconductor layer 14, a second channel region 142 is formed in a part of an interface with respect to the etching stop film 15. More specifically, a region on the interface overlapping with the gap between the source electrode 161 and the drain electrode 162 in the plane view is the second channel region 142. The second channel region 142 is a region where a carrier density can be controlled according to a voltage of the top gate electrode 18. In the first channel region 141, a length $L_B$ of the horizontal direction on the plane in FIG. 1 and FIG. 2 will be referred to as a first channel length. In the second channel region 142, a length $L_T$ of the horizontal direction on the plane in FIG. 1 and FIG. 2 will be referred to as a second channel length. As illustrated in FIG. 1 and FIG. 2, in the oxide TFT 1 of this embodiment, the second channel length $L_T$ is shorter than the first channel length $L_B$.

In this embodiment, when the oxide TFT 1 configured as described above is driven, a potential of greater than or equal to a lower potential of a potential Vs of the source electrode 161 and a potential Vd of the drain electrode 162 is applied to the top gate electrode 18. The potential of the top gate electrode 18 is represented by Vtg. The characteristics of the oxide TFT 1 of this embodiment are represented by the following expressions of Expression (1) and Expression (2) or the following expressions of Expression (1) and Expression (3).

$$L_B > L_T \quad (1)$$

Here, $L_B$: First Channel Length
$L_T$: Second Channel Length $$Vtg \geq Vs \text{ and } Vs < Vd \quad (2)$$

$$Vtg \geq Vd \text{ and } Vs > Vd \quad (3)$$

Here,

Vtg: Potential of Top Gate Electrode 18
Vs: Potential of Source Electrode 161
Vd: Potential of Drain Electrode 162

In the oxide TFT 1, a first surface of the channel layer is in contact with a first insulating film. The channel layer is formed on an interface of the oxide semiconductor layer 14. An example of the first insulating film is the gate insulating film 13. In addition, a second surface of the channel layer is in contact with a second insulating film. An example of the second insulating film is the etching stop film 15. Another example of the second insulating film is the passivation film 17 formed to be in contact with the etching stop film 15, particularly with an upper surface of the etching stop film 15. In addition, when the oxide TFT 1 is operated, the first channel region is formed on a first interface with respect to the channel layer of the first insulating film by a first gate electrode. An example of the first gate electrode is the bottom gate electrode 12. In addition, the second channel region is formed on a second interface with respect to the channel layer of the second insulating film by a second gate electrode. An example of the second gate electrode is the top gate electrode 18.

In this embodiment, the following effects are obtained. The oxide TFT 1 is driven such that the potential Vtg of the top gate electrode 18 is greater than or equal to a lower potential of the potential Vs of the source electrode 161 and the potential Vd of the drain electrode 162. Accordingly, even in a case where a charge is generated on the oxide TFT 1, initial properties are stable. Specifically, a fluctuation in a gate voltage at which the oxide TFT 1 is switched to ON from OFF, that is, a fluctuation in a threshold voltage (sometimes referred to as a threshold-voltage shift due to a potential of the top gate electrode) can be suppressed.

In the operation of oxide TFT in electronics devices such as flat-panel displays and sensors, the gate electrode of the oxide TFT is biased positively for a certain amount of time with respect to the source electrode (sometimes referred to as a positive gate stress). When a positive gate stress is applied to the oxide TFT 1, the fluctuation in the threshold voltage tends to be accelerated in a case where the potential Vtg of the top gate electrode 18 is less than a lower potential of the potential Vs of the source electrode 161 and the potential Vd of the drain electrode 162. However, in this embodiment, Vtg is greater than or equal to a lower potential of Vs and Vd, and thus, it is possible to suppress the fluctuation in the threshold voltage (sometimes referred to as a threshold-voltage shift due to a positive gate stress). That is, operation reliability of the oxide TFT 1 is improved.

The positive gate stress represents a state where a potential of greater than or equal to the potential of the source electrode or the drain electrode is applied to the gate electrode (a bias state). For example, the bias state is a state where a voltage at a high level is applied to the gate electrode, and a voltage at a low level is applied to the source electrode or the drain electrode. It is known that the threshold voltage is shifted due to the positive gate stress.

Embodiment 2

Figure 3:
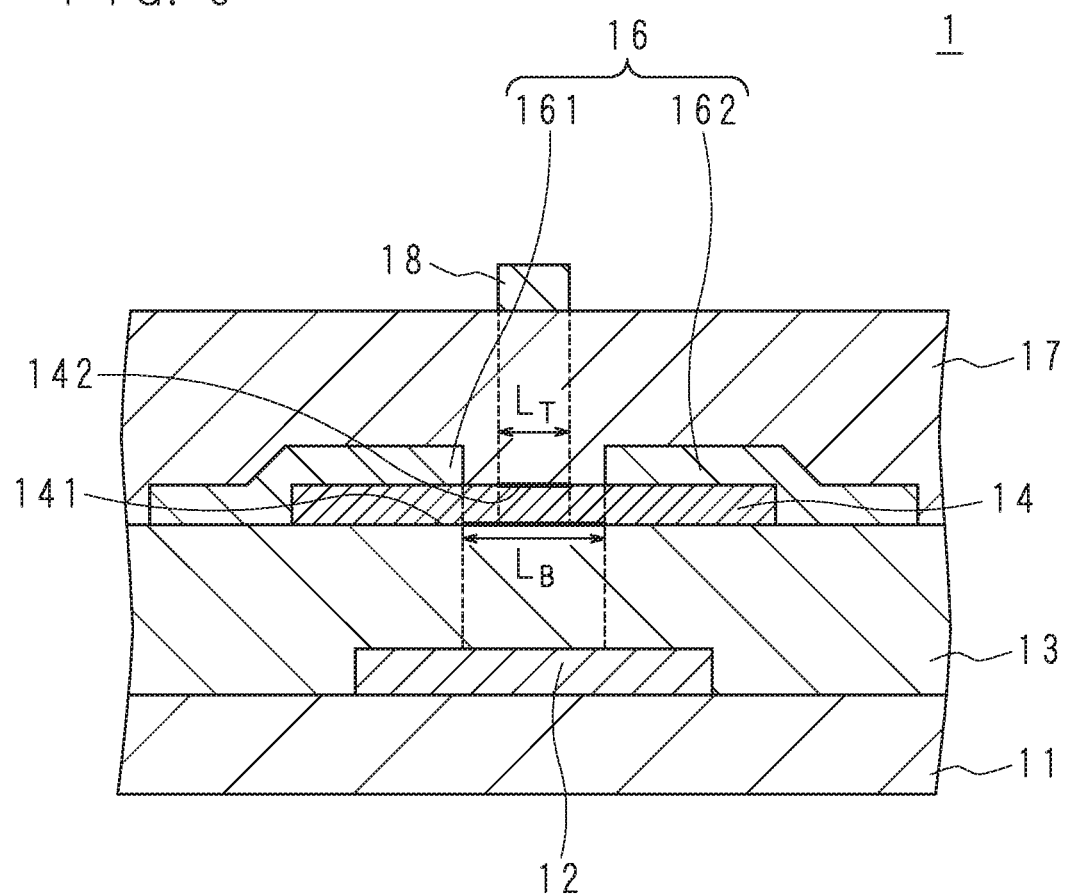
FIG. 3 is a cross-sectional view illustrating a configuration example of an oxide TFT according to a second embodiment.
Figure 4:
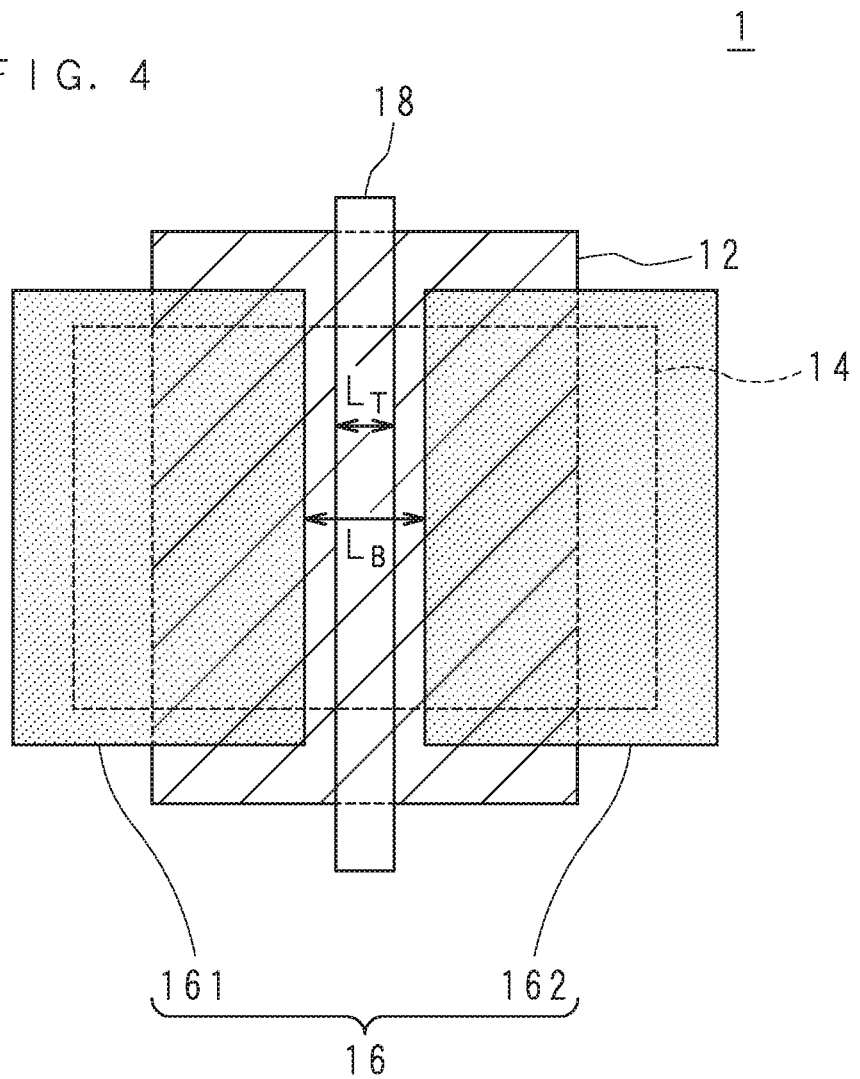
FIG. 4 is a plan view illustrating a configuration example of the oxide TFT according to the second embodiment.

FIG. 3 is a cross-sectional view illustrating a configuration example of the oxide TFT 1 according to a second embodiment. The oxide TFT 1 includes the substrate 11, the bottom gate electrode 12, the gate insulating film 13, the oxide semiconductor layer 14, the source and drain electrode 16, the passivation film 17, and the top gate electrode 18. FIG. 4 is a plan view illustrating a configuration example of the oxide TFT 1 according to the second embodiment. In FIG. 4, the bottom gate electrode 12, the oxide semiconductor layer 14, the source and drain electrode 16, and the top gate electrode 18 are illustrated. In FIG. 3 and FIG. 4, the same reference numerals are applied to constituents having the same functions as those of Embodiment 1. In the following description, a difference from Embodiment 1 will be mainly described.

As illustrated in FIG. 3, in the oxide TFT 1, the bottom gate electrode 12, the gate insulating film 13, the oxide semiconductor layer 14, the source and drain electrode 16, the passivation film 17, and the top gate electrode 18 are laminated on the substrate 11 in this order.

The source and drain electrode 16 includes two electrodes of the electrode 161 and the electrode 162. As with Embodiment 1, for the sake of simplicity, the electrode 161 will be referred to as the source electrode 161, and the electrode 162 will be referred to as the drain electrode 162. The source electrode 161 and the drain electrode 162 have approximately the same shape. As illustrated in FIG. 3 and FIG. 4, the source electrode 161 and the drain electrode 162 are apposed with a gap.

As illustrated in FIG. 3, in the oxide TFT 1 of this embodiment, the horizontal width of the bottom gate electrode 12 (the length of the horizontal direction on the plane) is less than the horizontal width of the oxide semiconductor layer 14. The horizontal width of the top gate electrode 18 is less than the horizontal width of the gap between the source electrode 161 and the drain electrode 162. In other words, the length of the top gate electrode 18 is shorter than a length between edges of the source electrode 161 and the drain electrode 162. Thus, the oxide TFT 1 of this embodiment is a channel etching type TFT. In the oxide TFT 1, the oxide semiconductor layer 14 is the channel layer. The passivation film 17 is an example of the second insulating film. In this embodiment, the second insulating film is a single layer film formed in a single process. Furthermore, in FIG. 3, the horizontal width of the gate electrode 12 is narrower than the horizontal width of the oxide semiconductor layer 14, but is not limited thereto. The horizontal width of the gate electrode 12 may be wider than the horizontal width of the oxide semiconductor layer 14.

In the oxide semiconductor layer 14, the first channel region 141 is formed in a part of the interface with respect to the gate insulating film 13. More specifically, a region on the interface overlapping with the gap between the source electrode 161 and the drain electrode 162 in the plane view is the first channel region 141. In addition, in the oxide semiconductor layer 14, the second channel region 142 is formed in a part of the interface with respect to the passivation film 17. More specifically, a region on the interface overlapping with the top gate electrode 18 in the plane view is the second channel region 142.

As with Embodiment 1, a channel length of the first channel region is set to a first channel length $L_B$, and a channel length of the second channel region is set to a second channel length $L_T$. In this embodiment, the first channel length $L_B$ are identical to a horizontal width of a gap between the source electrode 161 and the drain electrode 162. The second channel length $L_T$ is identical to the horizontal width of the top gate electrode 18. As with Embodiment 1, in the oxide TFT 1 of this embodiment, the second channel length $L_T$ is shorter than the first channel length $L_B$.

In addition, in this embodiment, when the oxide TFT 1 is driven, as with Embodiment 1, a potential of greater than or equal to a lower potential of the potential Vs of the source electrode 161 and the potential Vd of the drain electrode 162 is applied to the top gate electrode 18.

In this embodiment, the following two configurations, which are similar to that of Embodiment 1, are adopted. That is, 1) a configuration in which the second channel length $L_T$ is shorter than the first channel length $L_B$, and 2) a configuration in which a potential greater than or equal to a lower potential of Vs and Vd is applied to the top gate electrode 18 at the time of being driven are adopted. For this reason, the same effects as those of Embodiment 1 are obtained.

Embodiment 3

Figure 5:
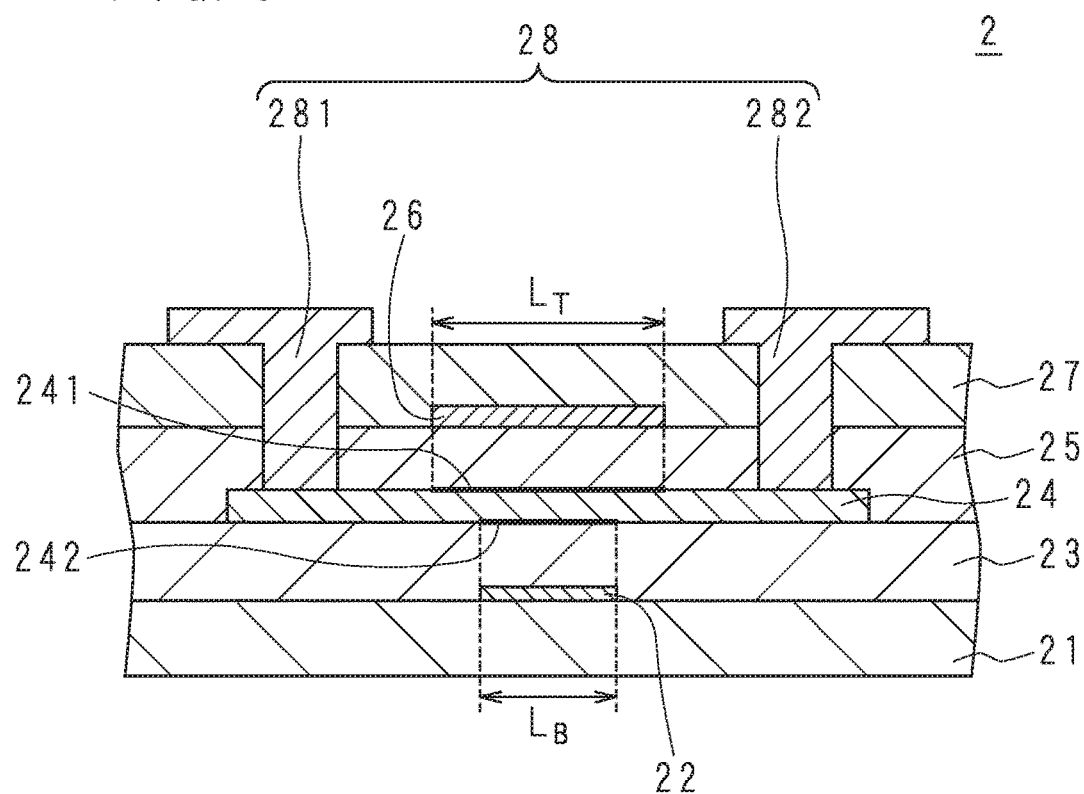
FIG. 5 is a cross-sectional view illustrating a configuration example of an oxide TFT according to a third embodiment.

FIG. 5 is a cross-sectional view illustrating a configuration example of the oxide TFT 2 according to a third embodiment. An oxide TFT 2 includes a substrate 21, a bottom gate electrode 22, a gate insulating film 23, an oxide semiconductor layer 24, an interlayer insulating film 25, a top gate electrode 26, a passivation film 27, and a source and drain electrode 28.

Figure 6:
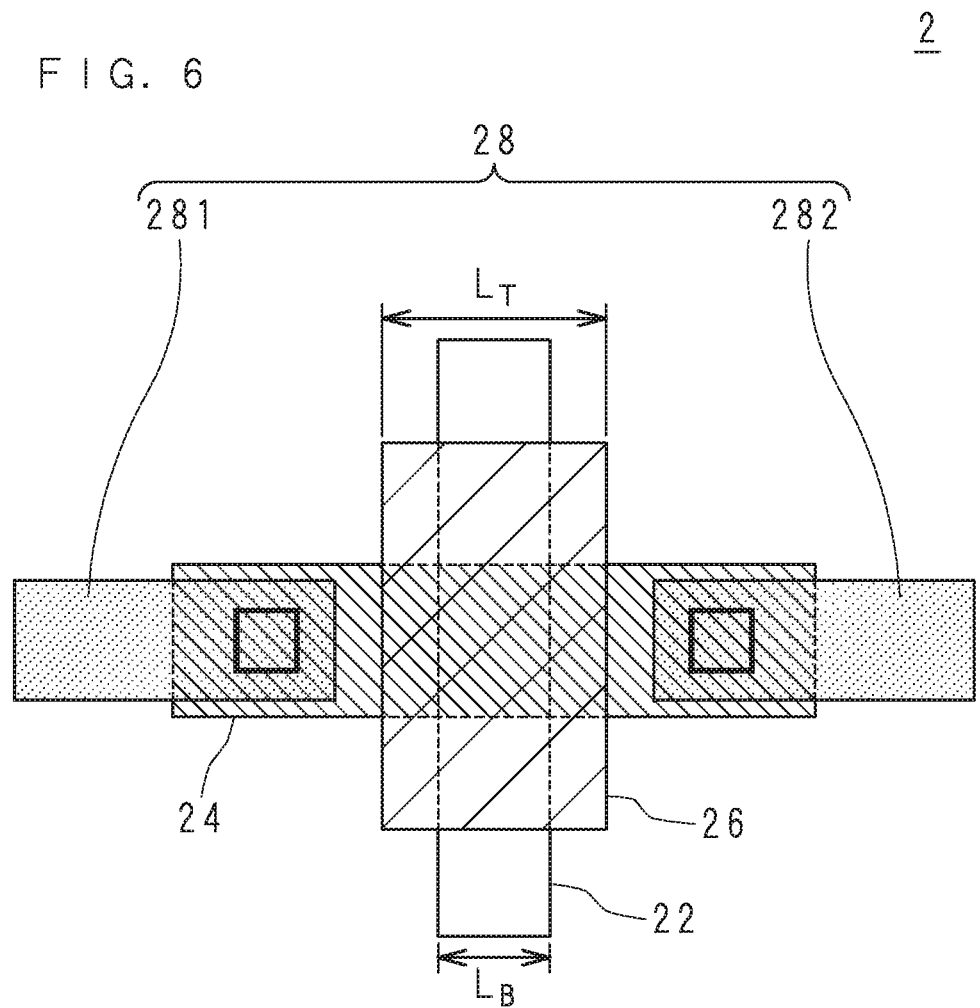
FIG. 6 is a plan view illustrating a configuration example of the oxide TFT according to the third embodiment.

FIG. 6 is a plan view illustrating a configuration example of the oxide TFT 2 according to the third embodiment. In FIG. 6, the bottom gate electrode 22, the oxide semiconductor layer 24, the top gate electrode 26, and the source and drain electrode 28 are illustrated.

As illustrated in FIG. 5, in the oxide TFT 2, the bottom gate electrode 22, the gate insulating film 23, the oxide semiconductor layer 24, the interlayer insulating film 25, the top gate electrode 26, the passivation film 27, and the source and drain electrode 28 are laminated on the substrate 21 in this order.

The substrate 21 is in the shape of a rectangular plate. The substrate 21 is an insulating substrate such as a glass substrate.

The bottom gate electrode 22 and the top gate electrode 26 are formed of the same materials as those of the bottom gate electrode 12 and the top gate electrode 18 of Embodiment 1. The gate insulating film 23, the interlayer insulating film 25, and the passivation film 27 are formed of the same materials as those of the gate insulating film 13 of Embodiment 1. The oxide semiconductor layer 24 is formed of the same materials as those of the oxide semiconductor layer 14 of Embodiment 1.

The source and drain electrode 28 includes two electrodes of an electrode 281 and an electrode 282. One electrode of two electrodes of the electrode 281 and the electrode 282 functions as the source electrode, and the other electrode functions as the drain electrode, according to an operation state of the oxide TFT 2. That is, in a case where the electrode 281 functions as the source electrode, and the electrode 282 functions as the drain electrode, there is a case where the electrode 281 functions as the drain electrode, and the electrode 282 functions as the source electrode. In the following description, for the sake of simplicity, the electrode 281 will be referred to as the source electrode 281, and the electrode 282 will be referred to as the drain electrode 282. The source electrode 281 and the drain electrode 282 have approximately the same shape.

As illustrated in FIG. 5 and FIG. 6, the source electrode 281 and the drain electrode 282 are apposed with a gap. The source and drain electrode 28 is formed of the same materials as those of the source and drain electrode 16 of Embodiment 1.

As illustrated in FIG. 5, in the oxide TFT 2 of this embodiment, the length of the bottom gate electrode 22 in the horizontal direction on the plane (hereinafter, referred to as a horizontal width) is less than a horizontal width of the top gate electrode 26. A horizontal width of the gap between the source electrode 281 and the drain electrode 282 is greater than the horizontal width of the top gate electrode 26. Further, a horizontal width of the oxide semiconductor layer 24 is greater than the gap between the source electrode 281 and the drain electrode 282. Two contact holes are provided in the interlayer insulating film 25 and the passivation film 27. The source electrode 281 are respectively electrically connected to the oxide semiconductor layer 24 by using one of the two contact holes, the drain electrode 282 are respectively electrically connected to the oxide semiconductor layer 24 by using another of the two contact holes. Thus, the oxide TFT 2 of this embodiment is a top gate type TFT. In the oxide TFT 2, the channel layer is formed on the oxide semiconductor layer 24.

In the oxide semiconductor layer 24, a first channel region 241 is formed in a part of an interface with respect to the interlayer insulating film 25. More specifically, a region on the interface overlapping with the top gate electrode 26 in the plane view is the first channel region 241. The first channel region 241 is a region where a carrier density can be controlled according to a voltage of the top gate electrode 26. In addition, in the oxide semiconductor layer 24, a second channel region 242 is formed in a part of an interface with respect to the gate insulating film 23. More specifically, a region on the interface overlapping with the bottom gate electrode 22 in the plane view is the second channel region 242. The second channel region 242 is a region where a carrier density can be controlled according to a voltage of the bottom gate electrode 22.

In the first channel region 241, a length of an apposition direction of the source electrode 281 and the drain electrode 282, that is, a length $L_T$ in the horizontal direction on the plane in FIG. 5 and FIG. 6 will be referred to as a first channel length. In the second channel region 142, a length $L_B$ in the apposition direction will be referred to as a second channel length. As illustrated in FIG. 5 and FIG. 6, in the oxide TFT 2 of this embodiment, the second channel length $L_B$ is shorter than the first channel length $L_T$.

In this embodiment, when the oxide TFT 2 configured as described above is driven, a potential of greater than or equal to a lower potential of a potential Vs of the source electrode 281 and a potential Vd of the drain electrode 282 is applied to the bottom gate electrode 22. The potential of the bottom gate electrode 22 is represented by Vbg. The characteristics of the oxide TFT 2 of this embodiment described above are represented by the following expressions of Expression (4) and Expression (5) or the following expressions of Expression (4) and Expression (6).

$$L_T > L_B \tag{4}$$

Here, $L_T$: First Channel Length $L_B$: Second Channel Length $$Vbg \geq Vs \text{ and } Vs < Vd \quad (5)$$

$$Vbg \geq Vd \text{ and } Vs > Vd \quad (6)$$

Here,

Vbg: Potential of Bottom Gate Electrode 22
Vs: Potential of Source Electrode 281
Vd: Potential of Drain Electrode 282

In this embodiment, the following effects are obtained from 1) a configuration in which the second channel length $L_B$ is shorter than the first channel length $L_T$, and 2) a configuration in which the oxide TFT 2 is driven such that a potential Vbg of the bottom gate electrode 22 is greater than or equal to a lower potential of the potential Vs of the source electrode 281 or of the potential Vd of the drain electrode 282. Even in a case where a charge is generated on the oxide TFT 2, the initial properties are stable. Specifically, a fluctuation in a gate voltage at which the oxide TFT 2 is switched to ON from OFF, that is, a fluctuation in a threshold voltage can be suppressed.

In addition, when a positive gate stress is applied to the oxide TFT 2, the fluctuation in the threshold voltage tends to be accelerated in a case where the potential Vbg of the bottom gate electrode 22 is less than a lower potential of the potential Vs of the source electrode 281 and the potential Vd of the drain electrode 282. However, in this embodiment, Vbg is greater than or equal to a lower potential of Vs and Vd, and thus, it is possible to suppress the fluctuation in the threshold voltage. That is, operation reliability of the oxide TFT 2 is improved.

Circuit Example 1

Figure 7:
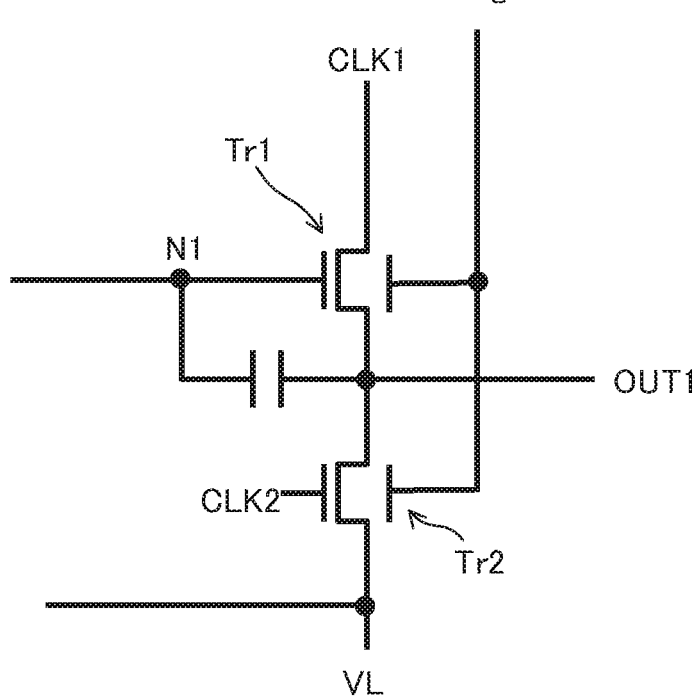
FIG. 7 is a circuit diagram illustrating an example of an output stage of a gate driver.

Some examples of a circuit using the oxide TFT explained above will be described below. FIG. 7 is a circuit diagram illustrating an example of an output stage of a gate driver. The gate driver generates a gate signal (a scanning signal) in a display device or the like. In FIG. 7, the bottom gate type oxide TFT 1 described in Embodiment 1 or 2 is used as Tr1 and Tr2. A first thin film transistor (Tr1) connects a first clock signal CLK1 to an output terminal OUT1. A second thin film transistor (Tr2) connects the output terminal OUT1 to a power source VL.

In FIG. 7, in a case of using a two-phase clock, for example, a positive voltage having a duty ratio of 50% is applied to a bottom gate electrode of Tr2. For this reason, stability with respect to a positive gate stress is required. In addition, a high voltage is applied to the bottom gate electrode of Tr1 due to a bootstrap effect, and thus, the positive gate stress becomes more severe. However, the oxide TFT 1 described in Embodiment 1 or 2 is used as Tr1 and Tr2, and a potential applied to a top gate is set to be greater than a source potential, and thus, it is possible to obtain the stability with respect to the positive gate stress.

Circuit Example 2

Figure 8:
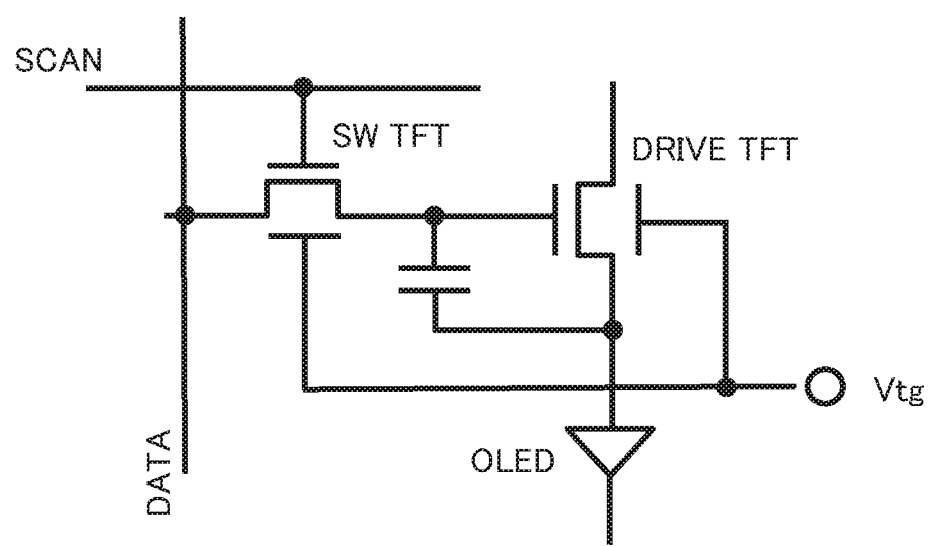
FIG. 8 is a circuit diagram illustrating an example of a pixel circuit.

FIG. 8 is a circuit diagram illustrating an example of a pixel circuit. FIG. 8 illustrates a pixel circuit of a display device in which an organic light emitting diode (OLED) is a light emitting element. The OLED is a light emitting element including an organic light emitting layer. The pixel circuit includes a switching TFT (SW TFT) and a driving TFT (DRIVE TFT). The switching TFT is turned ON and OFF according to a scanning signal supplied through a scanning line (SCAN). The driving TFT controls a current flowing into the OLED. In a case where a threshold voltage of the switching TFT fluctuates, there is a concern that timing when the OLED emits light is shifted. In addition, in a case where a threshold voltage of the driving TFT fluctuates, there is a concern that an error occurs in the brightness of the OLED. This causes a decrease in display quality, such as the flicker or the unevenness of the display. The oxide TFT 1 described in Embodiment 1 or 2 is used in the switching TFT and the driving TFT, and thus, it is possible to contribute to operation stability of the pixel circuit and to prevent a decrease in the display quality.

Circuit Example 3

FIG. 9 is a circuit diagram illustrating an example of the pixel circuit. FIG. 9 illustrates an example of the pixel circuit in a liquid crystal display (LCD). In the LCD, a plurality of pixels are arranged two-dimensionally, and more specifically, are arranged into the shape of a matrix. In order to ensure the visibility of the drawing, a circuit of nine pixels in total having three pixels in a vertical direction multiply three pixels in a horizontal direction is illustrated. TFTs (S11 to S33) arranged in each of the pixels is turned ON and OFF according to a scanning signal supplied from scanning lines (G1 to G3). That is, the TFT is an example of a switching element. When the TFT is turned ON, charges according to data signals supplied from data lines (D1 to D3) are retained in storage capacitances (C1 to C33). In the LCD, in a case where a threshold voltage of the TFT of each of the pixels fluctuates, the storage of the charge with respect to the storage capacitance becomes insufficient (writing deficiency). The writing deficiency of the storage capacitance causes a decrease in the display quality, such as the flicker and the display unevenness.

Figure 10:
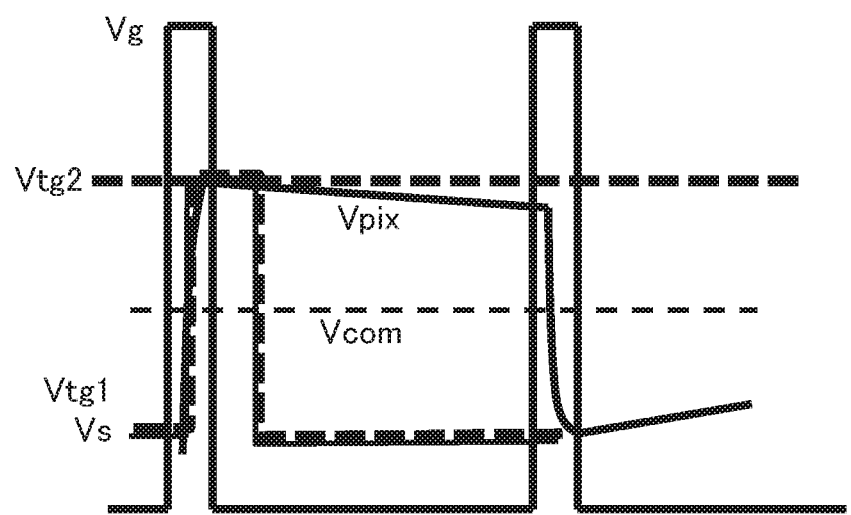
FIG. 10 is a graph illustrating a control example of a potential of a top gate electrode.

Therefore, the oxide TFT 1 described in Embodiment 1 or 2 is used as the TFTs arranged in each of the pixels. Then, control is performed by setting the potential Vtg of the top gate electrode 18 to be higher than the potential Vs of the source electrode 161. FIG. 10 is a graph illustrating a control example the potential of the top gate electrode 18. A horizontal axis represents time, and a vertical axis represents a potential. A graph attached with Vcom represents a displacement in a common potential. A graph attached with Vg represents a displacement in the potential Vtg of the top gate electrode 18. A graph attached with Vs represents a displacement in the potential Vs of the source electrode 161. A graph attached with Vpix represents a displacement of a potential of a terminal on a side connected to the TFT in the storage capacitance. Vtg1 and Vtg2 represent control examples of a potential applied to the top gate electrode 18.

A graph attached with Vtg1 is an example in which the potential Vtg of the top gate electrode 18 follows the potential Vs of the source electrode. Vtg may be greater than or equal to Vs, and thus, Vtg may follow Vs. A graph attached with Vtg2 is an example in which the potential Vtg of the top gate electrode 18 is retained to be constant. In a case where Vtg is retained to be a maximum value of the source potential Vs, Vtg is greater than or equal to Vs. The maximum value of Vs may be obtained by calculating a theoretical value on design, or by actual measurement. In addition, a potential which is slightly higher than the obtained potential may be used as Vtg, in consideration of an error.

The oxide TFT 1 described in Embodiment 1 or 2 is used in the pixel circuit of the LCD, and thus, it is possible to contribute to the operation stability of the pixel circuit, and to prevent a decrease in the display quality.

In Circuit Examples 1 to 3, only the circuit example using the bottom gate type TFT has been described, but the example is not limited thereto. The oxide TFT 2 described in Embodiment 3 can be used in a circuit example using the top gate type TFT. In such a case, effects to be obtained are identical to the effects described above.

Embodiment 4

Figure 11:
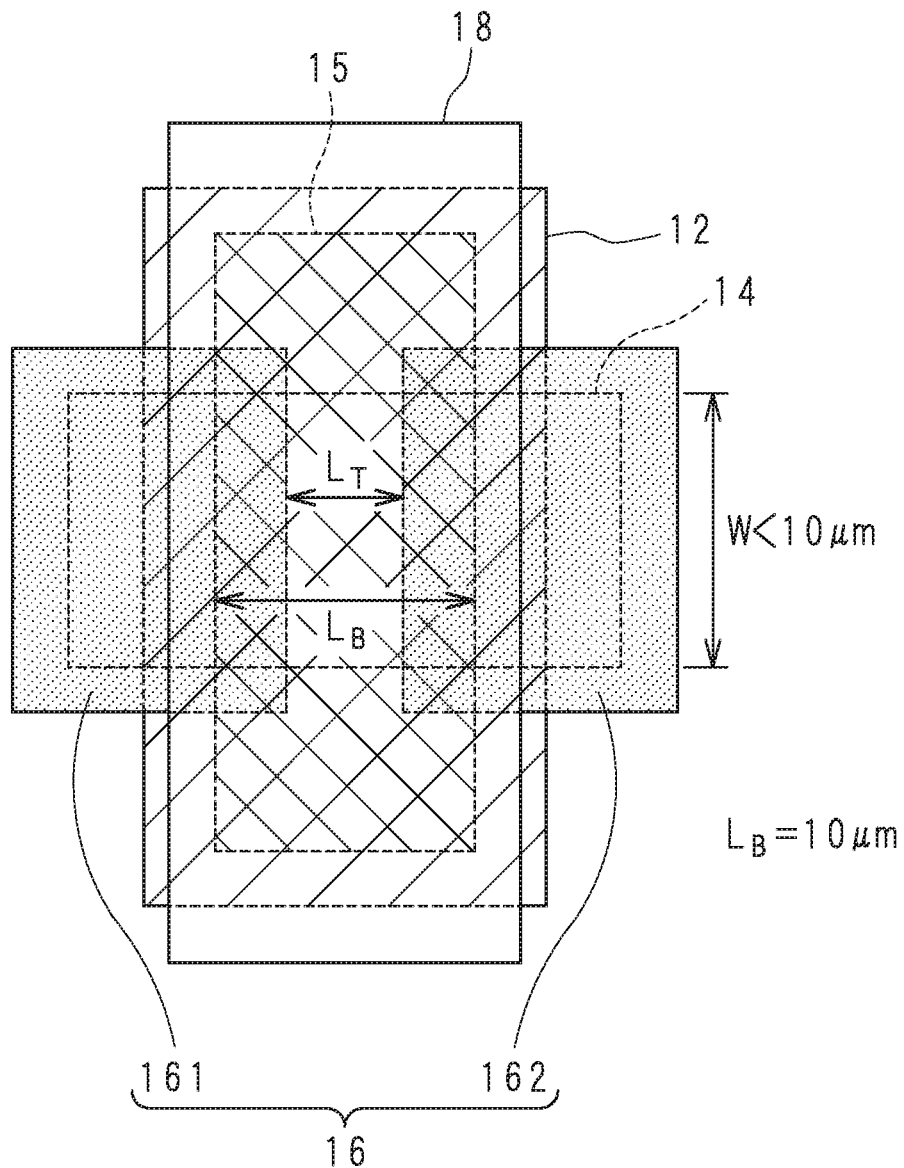
FIG. 11 is a plan view illustrating a configuration example of an oxide TFT according to a fourth embodiment.

In this embodiment, a design condition is added to the oxide TFT 1 described in Embodiment 1. FIG. 11 is a plan view illustrating a configuration example of the oxide TFT 1 according to a fourth embodiment. In FIG. 11, the same reference numerals as those of Embodiment 1 are applied to the same configurations as those of Embodiment 1. The oxide TFT 1 of this embodiment is an etching stop type TFT. A difference from Embodiment 1 is that a condition is set in which a first channel length $L_B$ is 10 microns (μm), and a channel width W is less than or equal to 10 microns.

W/L is known as one of parameters representing the properties of a transistor. W is a channel width, and L is a channel length. In this embodiment, the channel length is the first channel length $L_B$. A plurality of oxide TFTs 1 are prepared in which the first channel length $L_B$ is set to 10 microns, and the channel width W is changed. In the plurality of oxide TFTs having different channel widths W, a fluctuation in the threshold voltage due to the positive gate stress is measured, and thus, an excellent result is obtained as W decreases. Therefore, the operation stability is obtained as the channel width W decreases. That is, in a case where the first channel length $L_B$ is set to 10 microns, it is desirable that the channel width W is set to be less than or equal to 10 microns.

According to this embodiment, the condition is added to the channel width W, and thus, it is possible to more reliably obtain the operation stability with respect to the positive gate stress in the oxide TFT 1. Furthermore, the condition of setting the channel width W to be smaller is an advantageous condition for the TFT driving the OLED.

Embodiment 5

Figure 12A:
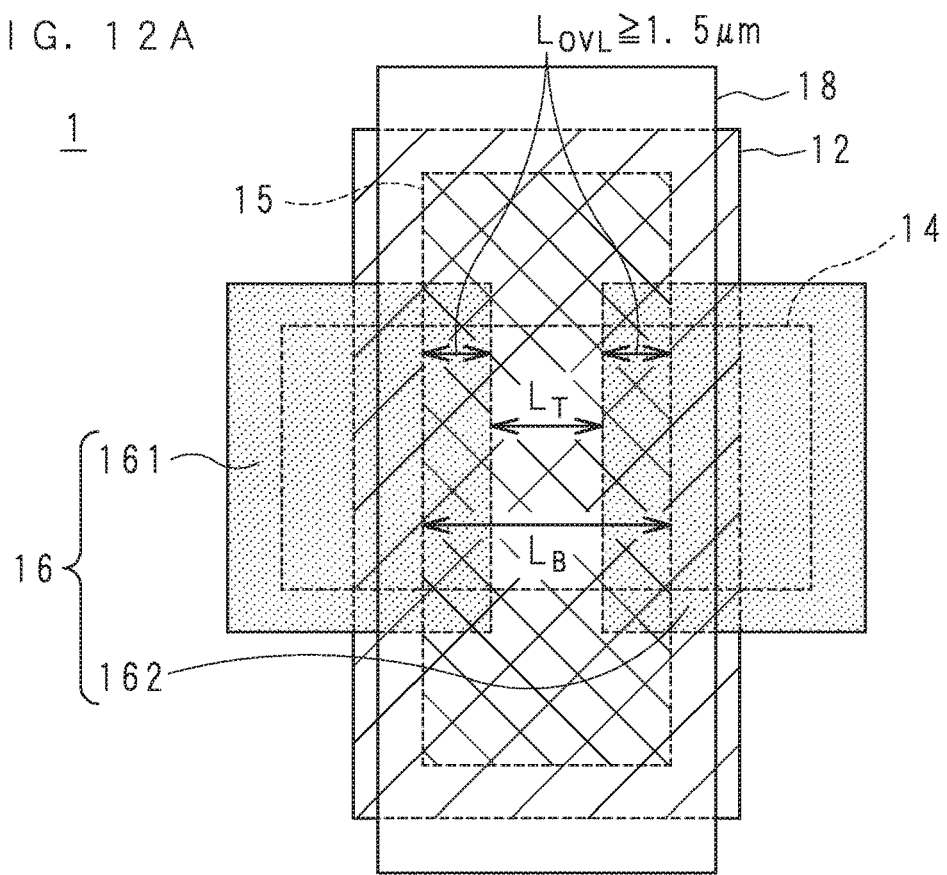
FIGS. 12A and 12B are explanatory diagrams illustrating a configuration example of an oxide TFT according to a fifth embodiment.
Figure 12B:
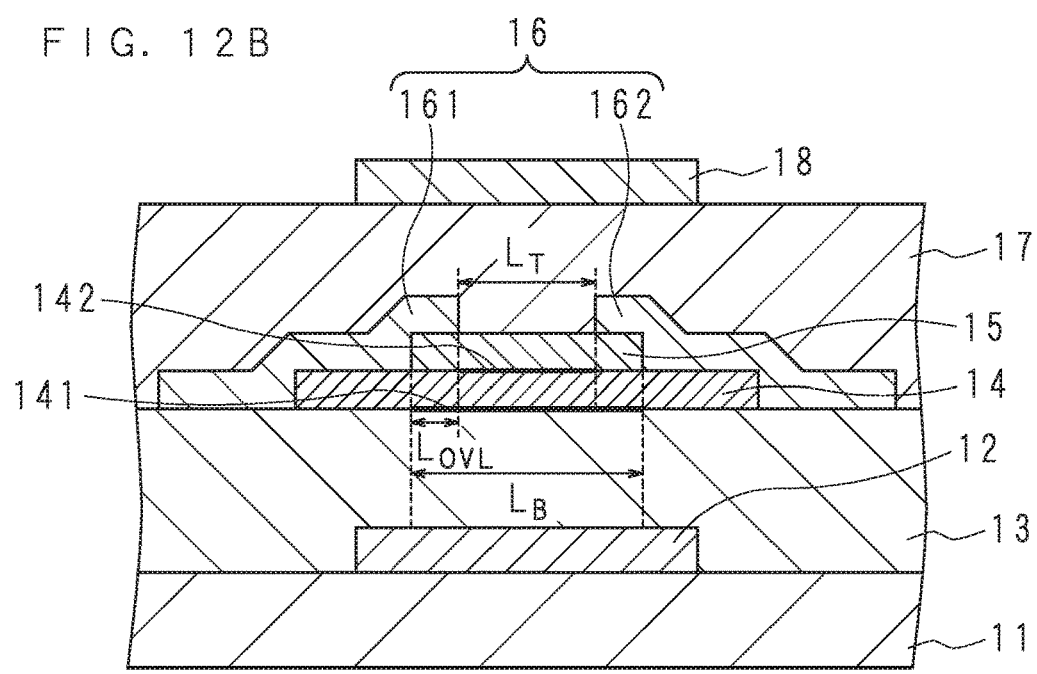

In this embodiment, a design condition is added to the oxide TFT 1 described in Embodiment 1. FIGS. 12A and 12B are explanatory diagrams illustrating a configuration example of the oxide TFT 1 according to a fifth embodiment. FIG. 12A is a plan view illustrating the configuration example of the oxide TFT 1. FIG. 12B is a cross-sectional view illustrating the configuration example of the oxide TFT 1. In FIG. 12A and FIG. 12B, the same reference numerals as those of Embodiment 1 are applied to the same configurations as those of Embodiment 1. The oxide TFT 1 of this embodiment is an etching stop type TFT. A difference from Embodiment 1 is that a condition is set in which a width (hereinafter, an overlap width) $L_{OVL}$ of a region where the first channel region overlaps with the source electrode 161 is greater than or equal to 1.5 microns in the plane view. The same applies to a width of a region where the first channel region overlaps with the drain electrode 162. In other words, the overlap width is the length of the channel length direction in which the etching stop film 15 overlaps with the source electrode 161 and the length of the channel length direction where the etching stop film 15 overlaps with the drain electrode 162.

It is considered that the operation stability of the oxide TFT 1 is obtained according to a difference between the first channel length $L_B$ and the second channel length $L_T$. Therefore, the effect is obtained as the difference increases. In a case where the overlap width $L_{OVL}$ increases, the second channel length $L_T$ decreases. Even in a case where the overlap width $L_{OVL}$ increases, the first channel length $L_B$ is not changed. Accordingly, it is considered that the difference between the first channel length $L_B$ and the second channel length $L_T$ increases, and thus, the operation stability of the oxide TFT 1 is improved. In the oxide TFT 1, in a case where the first channel length $L_B$ is set to 10 microns, it is desirable that the overlap width $L_{OVL}$ is set to be greater than or equal to 1.5 microns.

According to this embodiment, the condition is added to the overlap width $L_{OVL}$, and thus, it is possible to more reliably obtain the operation stability with respect to the positive gate stress in the oxide TFT 1. Furthermore, the condition of setting the overlap width $L_{OVL}$ to be larger is an advantageous condition for a TFT in which it is necessary to increase the channel width W.

Embodiment 6

Figure 13A:
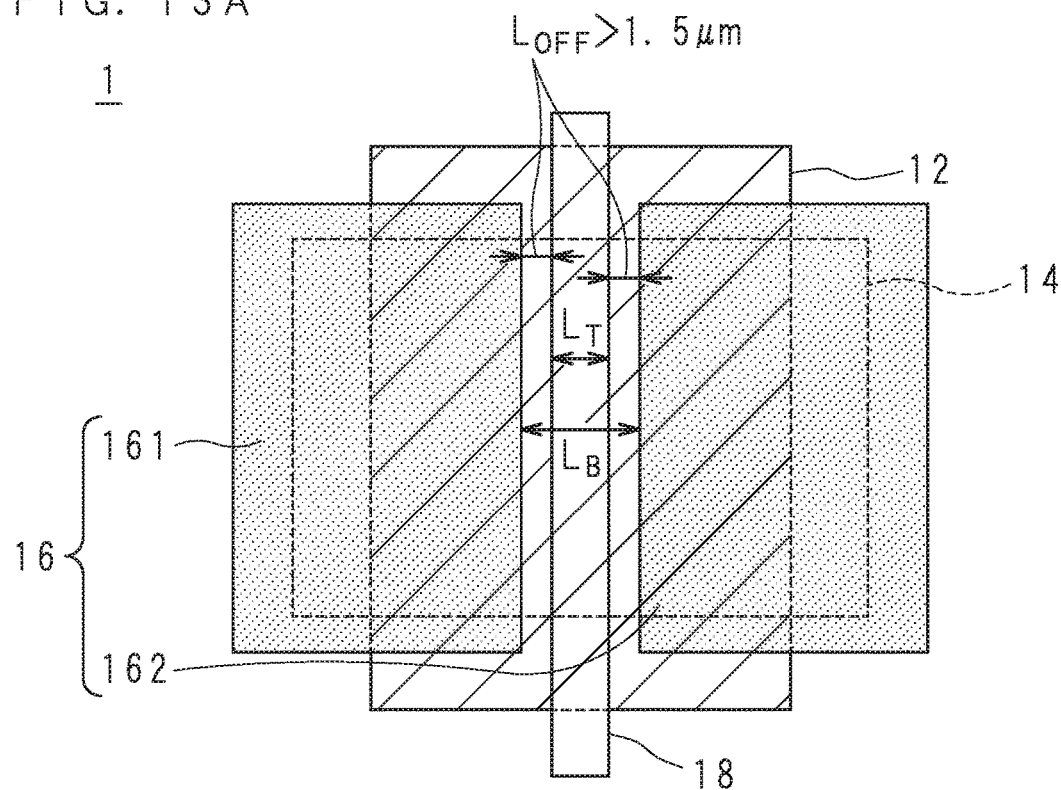
FIGS. 13A and 13B are explanatory diagrams illustrating a configuration example of an oxide TFT according to a sixth embodiment.
Figure 13B:
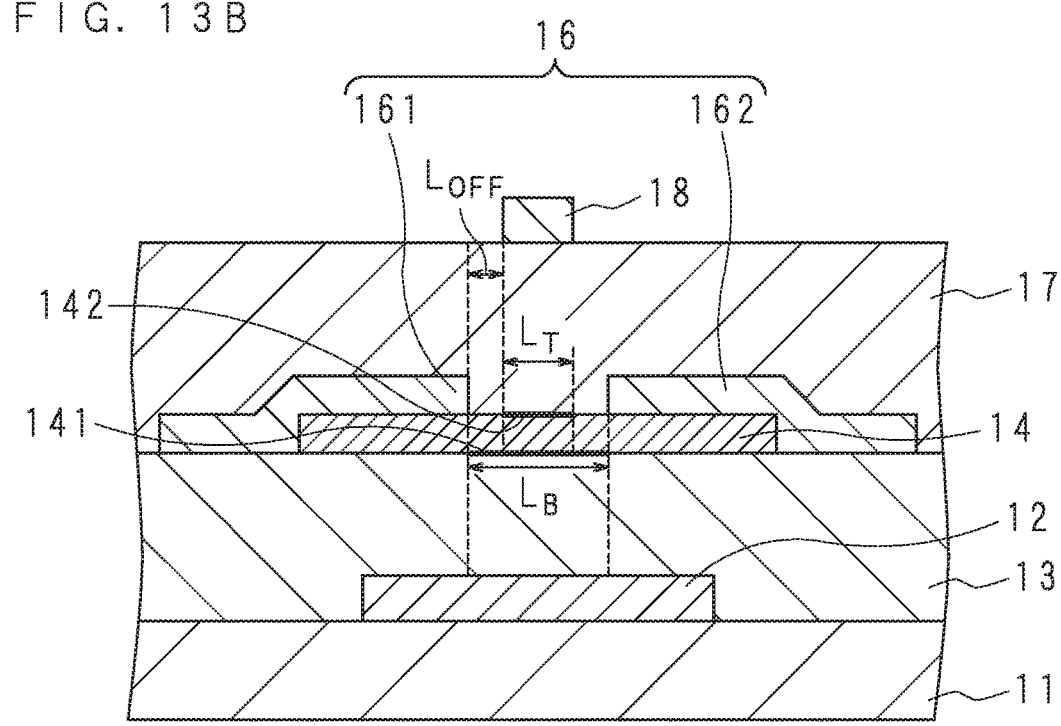

In this embodiment, a design condition is added to the oxide TFT 1 described in Embodiment 2. FIGS. 13A and 13B are explanatory diagrams illustrating a configuration example of the oxide TFT 1 according to a sixth embodiment. FIG. 13A is a plan view illustrating the configuration example of the oxide TFT 1. FIG. 13B is a cross-sectional view illustrating the configuration example of the oxide TFT 1. In FIG. 13A and FIG. 13B, the same reference numerals as those of Embodiment 2 are applied to the same configurations as those of Embodiment 2. The oxide TFT 1 of this embodiment is a channel etching type TFT. A difference from Embodiment 2 is that a condition is set in which a distance (hereinafter, a gap width) $L_{OFF}$ of the gap between the source electrode 161 and the top gate electrode 18 and a distance of the gap between the drain electrode 162 and the top gate electrode 18 is greater than or equal to 1.5 microns in the plane view.

It is considered that the operation stability of the oxide TFT 1 is obtained according to the difference between the first channel length $L_B$ and the second channel length $L_T$. Therefore, the effect is obtained as the difference increases. In a case where the gap width $L_{OFF}$ increases, the second channel length $L_T$ decreases, on the basis of constraints that the distance of the gap between the source electrode 161 and the drain electrode 162 is not changed. Even in a case where the gap width $L_{OFF}$ increases, the first channel length $L_B$ is not changed. Accordingly, it is considered that the difference between the first channel length $L_B$ and the second channel length $L_T$ increases, and thus, the operation stability of the oxide TFT 1 is improved. In the oxide TFT 1, in a case where the first channel length $L_B$ is set to 10 microns, it is desirable that the gap width $L_{OFF}$ is set to be greater than or equal to 1.5 microns.

According to this embodiment, the condition is added to the gap width $L_{OFF}$, and thus, it is possible to more reliably obtain the operation stability with respect to the positive gate stress in the oxide TFT 1. Furthermore, the condition of setting the gap width $L_{OFF}$ to be larger is an advantageous condition for a TFT in which it is necessary to increase the channel width W.

Embodiment 7

Figure 14A:
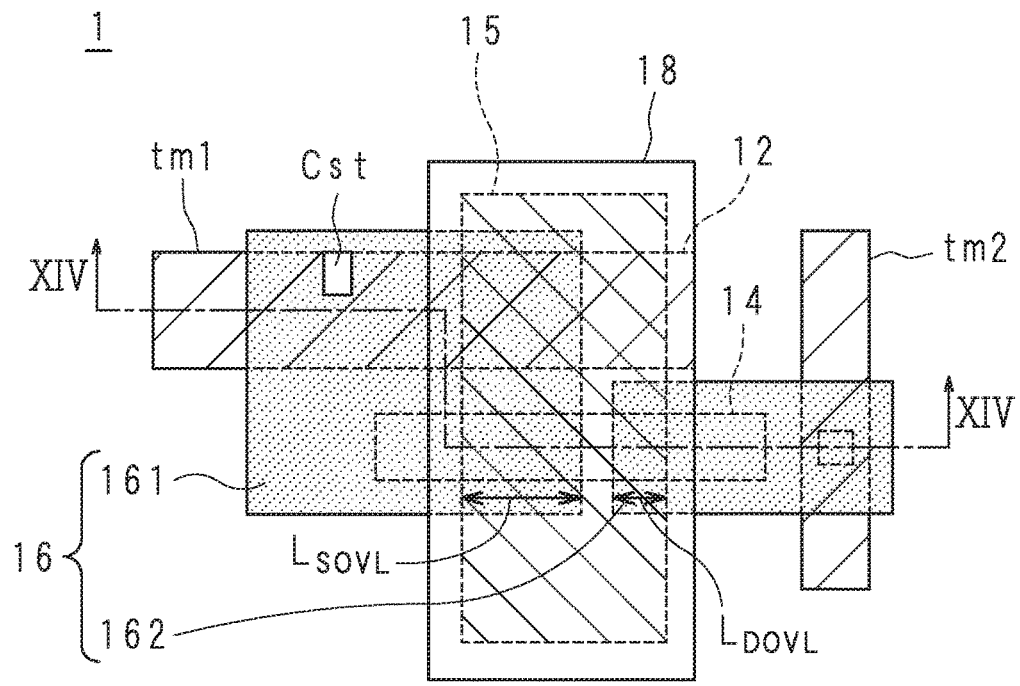
FIGS. 14A and 14B are explanatory diagrams illustrating a configuration example of an oxide TFT according to a seventh embodiment.
Figure 14B:
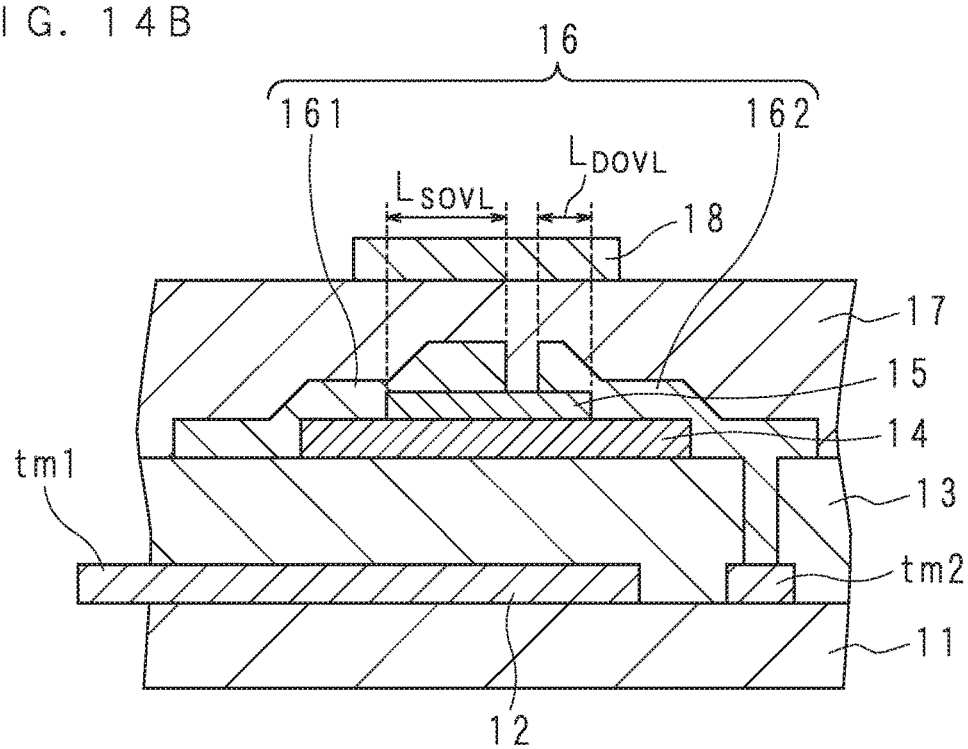

In the oxide TFT 1 of this embodiment, a design condition is added to the oxide TFT 1 of Embodiment 1. FIGS. 14A and 14B are explanatory diagrams illustrating a configuration example of the oxide TFT 1 according to a seventh embodiment. FIG. 14A is a plan view illustrating the configuration example of the oxide TFT 1. FIG. 14B is a cross-sectional view taken along line XIV-XIV of FIG. 14A. In FIGS. 14A and 14B, the same reference numerals as those of Embodiment 1 are applied to the same configurations as those of Embodiment 1. The oxide TFT 1 of this embodiment is an etching stopping type TFT. A difference from Embodiment 1 is that a condition is set in which a width (hereinafter, a source wrap width) $L_{SOVL}$ of the region where the first channel region overlaps with the source electrode 161 is greater than a width (hereinafter, a drain wrap width)

$L_{DOVL}$ of the region where the first channel region overlaps with the drain electrode 162 in the plane view.

In addition, in this embodiment, a portion is formed in which a layer configuring the bottom gate electrode 12 overlaps with a layer configuring the source electrode 161 in the plane view, and thus, a capacitor Cst is configured between the bottom gate electrode 12 and the source electrode 161. FIGS. 14A and 14B illustrate two elements of the oxide TFT 1 and the capacitor Cst. A terminal tm1 represents a terminal to which the gate electrode 12 and the capacitor Cst are connected, and a terminal tm2 represents a terminal to which the drain electrode is connected.

Figure 15A:
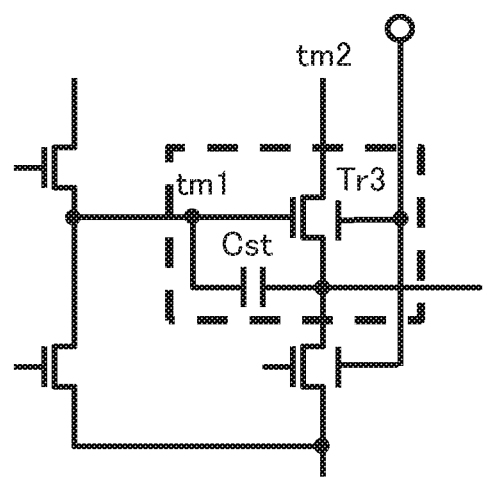
FIGS. 15A and 15B are circuit diagrams illustrating a circuit example using the oxide TFT.
Figure 15B:
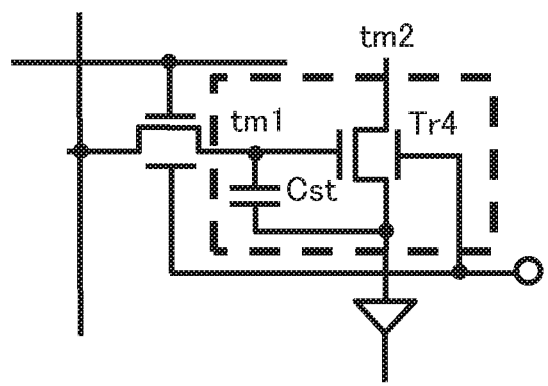

FIGS. 15A and 15B are circuit diagrams illustrating a circuit example using the oxide TFT 1. FIG. 15A illustrates a circuit example of the output stage of the gate driver. FIG. 15B illustrates an example of the pixel circuit of the OLED. Tr3 and the capacitor Cst illustrated in FIG. 15A can be realized by the configuration illustrated in FIGS. 14A and 14B. In addition, Tr4 and the capacitor Cst illustrated in FIG. 15B can also be realized by the configuration illustrated in FIGS. 14A and 14B. The terminals tm1 and tm2 illustrated in FIG. 15A and FIG. 15B correspond to the terminals tm1 and tm2 illustrated in FIG. 14A and FIG. 14B. In a case where the oxide TFT 1 of this embodiment is used as Tr3 and Tr4, according to the configuration illustrated in FIGS. 14A and 14B, it is possible to efficiently prepare the oxide TFT 1 and the capacitor Cst.

In addition, in the oxide TFT 1, the following effects are obtained by increasing a source wrap width $L_{SOVL}$ on a source side connected to the capacitor Cst. As with the other embodiments described above, the operation stability with respect to the positive gate stress is improved. Further, the source wraps width $L_{SOVL}$ increases, and thus, a region functioning as the capacitor Cst increases. Accordingly, it is possible to decrease a plane area required for the configuration of the capacitor Cst, and thus, it is possible to decrease a plane area required for the configuration in which the oxide TFT 1 is combined with the capacitor Cst.

The plane area required for the configuration in which the oxide TFT 1 is combined with the capacitor Cst decreases in a case of being used in the pixel circuit of the OLED, and thus, an aperture ratio is improved. In addition, it is possible to decrease each of the pixels, and thus, it is possible to improve the definition of the display.

Driving Circuit Example

Figure 16:
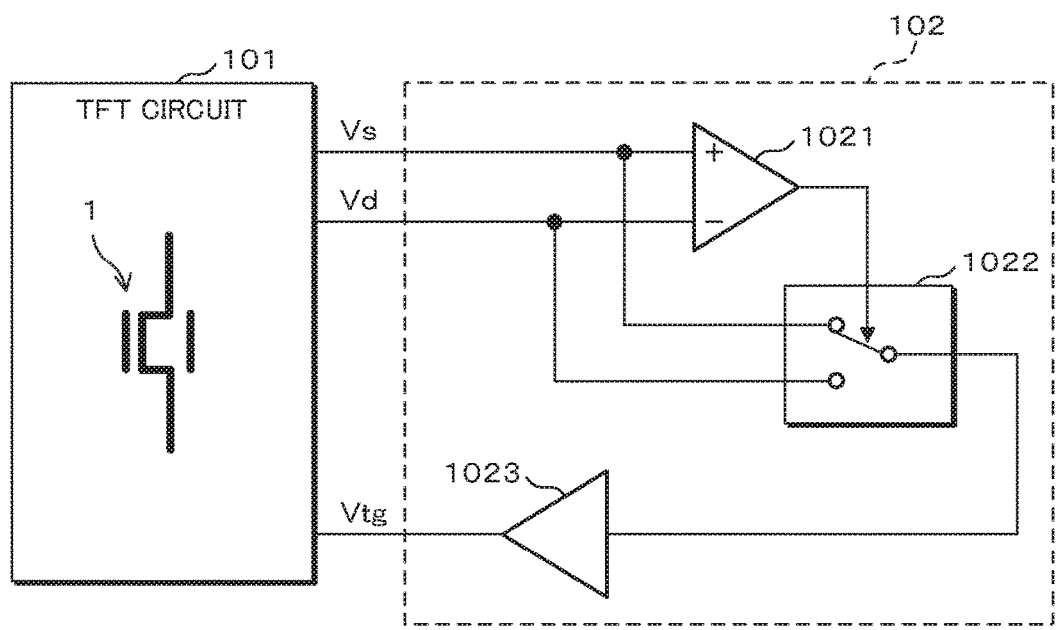
FIG. 16 is a circuit diagram illustrating an example of a driving circuit.

Next, the driving circuit of the oxide TFT 1 will be described. FIG. 16 is a circuit diagram illustrating an example of a driving circuit 100. The driving circuit 100 includes a TFT circuit 101 and an applying circuit 102. The TFT circuit 101 is a circuit including the oxide TFT 1. The configuration of the TFT circuit 101 is suitably designed according to the use of the oxide TFT 1. In addition, the same configuration can be applied to the driving circuit of the oxide TFT 2.

The applying circuit 102 is a circuit generating a potential which is applied to the top gate electrode 18 of the oxide TFT 1. The applying circuit 102 includes a comparator 1021, a switch 1022, and a buffer 1023. The comparator 1021 determines a magnitude relationship between Vs and Vd. Vs is the potential of the source electrode 161 of the oxide TFT 1. Vd is the potential of the drain electrode 162 of the oxide TFT 1. The switch 1022 is a switching switch. Vs and Vd are input into the switch 1022, and one of Vs and Vd is output from the switch 1022. The switching of the switch 1022 is controlled according to the output of the comparator 1021. According to the control of the comparator 1021, the switch 1022 outputs a lower potential of Vs and Vd. The buffer 1023 inputs the output of the switch 1022 to the TFT circuit 101. The input is applied to the top gate electrode 18 of the oxide TFT 1. Furthermore, the buffer 1023 may be substituted with an amplifier.

One applying circuit 102 is disposed on each of the oxide TFTs 1, but the number of applying circuits 102 is not limited thereto. In a case where the circuit includes a plurality of oxide TFTs 1, but the plurality of oxide TFTs 1 are not simultaneously operated, one applying circuit 102 may be provided. In addition, even in a case where the plurality of oxide TFTs 1 are simultaneously operated, on design, one applying circuit 102 may be provided in a case where of the same operation condition. That is, there is a case where all of the potentials planned to be applied to the top gate electrode 18 of the oxide TFT 1 which is operated may be the same potential, on design. In this case, Vs and Vd are set to the input of the applying circuit 102 with respect to one oxide TFT 1 of the oxide TFTs 1 which are simultaneously operated. The output of the applying circuit 102 is applied to the top gate electrodes of all of the oxide TFTs which are operated. Further, in a case where the potential planned to be applied to the top gate electrode 18 of the oxide TFT 1 can be uniquely determined, on design, the applying circuit 102 is set to a constant voltage source. In this case, a constant potential is applied to the top gate electrode 18.

Furthermore, the cross-sectional view referenced in the above description is for illustrating a lamination order of each of the layers, and the thickness or the size of each of the layers, and the size of the thickness between the respective layers (a magnitude relationship) are not limited to the illustrated aspects.

The technical characteristics (configuration requirements) described in each of the embodiments can be combined with each other, and according to the combination, new technical characteristics can be formed.

The embodiments disclosed herein are examples in all respects, and are necessarily considered as not being restrictive. The scope of the present disclosure is not limited to the above description, but is represented by the claims, and is intended to include all equivalents to the claims and all changes within the claims.

What is claimed is:

1. A thin film transistor, comprising:
   a source electrode and a drain electrode;
   a channel layer formed of an oxide semiconductor to which the source electrode and the drain electrode contact;
   a first insulating film and a first gate electrode which are formed on a first surface side of the channel layer, the first surface side does not contact the source electrode and the drain electrode;
   a first channel region which is formed from a first edge where the source electrode and the channel layer contact each other, to a second edge where the drain electrode and the channel layer contact each other, at a first interface between the channel layer and the first insulating film, a width of the first channel region is shorter than a width of the first gate electrode;
   a second insulating film and a second gate electrode which are formed on a second surface side of the channel layer, the second surface side contacting the source electrode and the drain electrode; and
   a second channel region which is formed in an area where the source electrode, the drain electrode, and the channel layer overlap is deducted from an area where the second gate electrode and the channel layer overlap, at a second interface between the channel layer and the second insulating film;

wherein the source electrode and the drain electrode are apposed with a gap therebetween, and in a case in which a length of a first distance in an apposition direction of the source electrode and the drain electrode in the first channel region is set to a first channel length, a length of a second distance in the apposition direction in the second channel region is set to a second channel length, the second channel length is shorter than the first channel length, and a potential applied to the second gate electrode is greater than or equal to a lower potential of potentials of the source electrode or the drain electrode.

2. The thin film transistor according to claim 1, wherein the thin film transistor is an etching stop type transistor in which the second insulating film is composed of an etching stop film which is in contact with the second surface side of the channel layer, and a passivation film which is in contact with the upper surface of the etching stop film.

3. The thin film transistor according to claim 2, wherein both of a length of a channel length direction in which the etching stop film overlaps with the source electrode and a length of the channel length direction in which the etching stop film overlaps with the drain electrode are greater than or equal to 1.5 microns.

4. The thin film transistor according to claim 2, wherein the length of the channel length direction in which the etching stop film overlaps with the source electrode is longer than the length of the channel length direction in which the etching stop film overlaps with the drain electrode.

5. The thin film transistor according to claim 1, wherein the thin film transistor is a channel etching type transistor in which the second insulating film is a passivation film which is in contact with the second surface side of the channel layer, and a length of the second gate electrode is shorter than a length between edges of the source electrode and the drain electrode.

6. The thin film transistor according to claim 5, wherein a length from the edges of the source electrode and the drain electrode to an edge of the second gate electrode is greater than or equal to 1.5 microns.

7. The thin film transistor according to claim 1, wherein a channel width is less than or equal to 10 microns.

8. A display device, comprising:

a plurality of pixels respectively including a switching element including the thin film transistor according to claim 1 and a display element, and arranged two-dimensionally; and an applying circuit applying a lower potential of potentials of a source electrode or a drain electrode of the switching element to a second gate electrode of the switching element.

9. A transistor circuit, comprising:

a plurality of thin film transistors, wherein each of the plurality of thin film transistors is the thin film transistor according to claim 1.

10. The transistor circuit according to claim 9, comprising:

a first thin film transistor configured of the thin film transistor connecting a first clock signal to an output terminal; and a second thin film transistor configured of the thin film transistor connecting the output terminal to a power source.

11. The transistor circuit according to claim 9, further comprising:

a light emitting element including an organic light emitting layer;

a capacitance;

where:

a driving transistor configured of the thin film transistor allowing a current according to a voltage of the capacitance to flow into the light emitting element; and a switching transistor configured of the thin film transistor controlling an operation of the driving transistor.

12. A driving method of a thin film transistor, comprising:

detecting potentials of a source electrode and a drain electrode of the thin film transistor according to claim 1;

specifying a lower potential of the detected potentials of the source electrode and the drain electrode;

generating a potential greater than or equal to the specified potential; and applying the generated potential to a second gate electrode of the thin film transistor.

13. The driving method of a thin film transistor according to claim 12, further comprising:

driving a first thin film transistor configured of the thin film transistor connecting a first clock signal to an output terminal and a second thin film transistor configured of the thin film transistor connecting the output terminal to a power source.

14. The driving method of a thin film transistor according to claim 12, further comprising:

driving a capacitance, a driving transistor configured of the thin film transistor allowing a current according to a voltage of the capacitance to flow into an organic light emitting layer, and a switching transistor configured of the thin film transistor controlling an operation of the driving transistor.

* * * * *